(12) United States Patent
Bodenweber et al.

(10) Patent No.: US 6,281,692 B1
(45) Date of Patent: Aug. 28, 2001

(54) INTERPOSER FOR MAINTAINING TEMPORARY CONTACT BETWEEN A SUBSTRATE AND A TEST BED

(75) Inventors: Paul F. Bodenweber, Kingston; Ralph R. Comulada, Rock Tavern; Mukta S. Farooq, Hopewell Junction; Charles J. Hendricks, Wappingers Falls, all of NY (US); Philo B. Hodge, Roxbury, CT (US); Vincent P. Peterson, Poughkeepsie, NY (US); Terence W. Spoor, Marlboro, NY (US); Kathleen M. Wiley, Wappingers Falls, NY (US); Yuet-Ying Yu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/166,468

(22) Filed: Oct. 5, 1998

(51) Int. Cl.[7] .................................................... G01R 31/02
(52) U.S. Cl. ............................................................... 324/755
(58) Field of Search .................................... 324/754, 755, 324/757, 758, 765, 761

(56) References Cited

U.S. PATENT DOCUMENTS

| | | | |
|---|---|---|---|
| 5,015,946 | * 5/1991 | Janko | 324/754 |
| 5,187,431 | * 2/1993 | Libretti | 324/754 |
| 5,418,469 | * 5/1995 | Turner et al. | 324/755 |
| 5,574,382 | 11/1996 | Kimura | 324/754 |
| 5,727,954 | 3/1998 | Kato et al. | 439/66 |
| 5,767,692 | 6/1998 | Antonella et al. | 324/761 |
| 5,773,988 | 6/1998 | Sayre et al. | 324/761 |

* cited by examiner

Primary Examiner—Ernest Karlsen
Assistant Examiner—Russell M Kobert
(74) Attorney, Agent, or Firm—Ira D. Blecker

(57) ABSTRACT

Disclosed is an interposer and test structure for making contact between a substrate and a test bed. One embodiment of the interposer has a floating, rigid conductive element in a nonconductive body which makes temporary contact between the test bed and the substrate. In another embodiment of the invention, the interposer includes two layers of material, in which one layer includes pogo pins for contacting the substrate and the other layer includes pads for contacting the test bed. The pogo pins are on a grid spacing corresponding to that of the substrate input/output pads while the interposer pads are on a grid spacing corresponding to that of the pogo pin contactors of the test bed.

10 Claims, 3 Drawing Sheets

INTERPOSER FOR MAINTAINING TEMPORARY CONTACT BETWEEN A SUBSTRATE AND A TEST BED

BACKGROUND OF THE INVENTION

The present invention relates to an interposer for electrically testing a ceramic substrate, and more particularly, relates to an interposer used to maintain temporary contact between a ceramic substrate and a test bed comprising so-called pogo pin contactors.

A ceramic substrate is used in the electronics industry for carrying at least one semiconductor device. Usually there are mounted a plurality of semiconductor devices on the ceramic substrate. A ceramic substrate usually consists of a plurality of insulative layers containing wiring patterns and vias which connect between the layers. In totality, the wiring patterns and vias form wiring nets and, in use, provide electrical contact between the various semiconductor devices and between the various semiconductor devices and the next level of packaging.

Before mounting the semiconductor devices, it is necessary to ensure that all the wiring nets are insulated from each other and have the proper electrical continuity.

Accordingly, it is necessary to have a temporary method of connecting the ceramic substrate with a test bed, which for the purposes of the present invention contains a plurality of pogo pin contactors. The ceramic substrate contains input/output devices which connect to the next level of packaging but are also used for testing the wiring nets of the ceramic substrate. The input/output devices may be, for example, pads, pins or solder balls. In the test bed, the pogo pin contactors have a single spring loaded tip which eventually must make electrical contact with the input/output devices of the ceramic substrate. Pogo pins may have single or double spring loaded tips.

Pogo pins and pogo pin contactors are generic for the class of telescoping, spring-loaded connecting pins. Pogo pins and pogo pin contactors are commercially available from companies such as Interconnect Devices, Inc., Kansas City, Kans. Whenever pogo pins and pogo pin contactors are used throughout this application, it should be understood that telescoping, spring-loaded connecting pins are intended.

Too, the input/output devices of the ceramic substrate may have a different grid than the test bed pogo pin contactors so it is necessary to have a grid transformer to accommodate the various differences in grids.

Various devices have been proposed for making nonpermanent connections between electronic devices.

Kato et al. U.S. Pat. No. 5,727,954, the disclosure of which is incorporated by reference herein, discloses an interposer for making connection between an integrated circuit device and a substrate. The interposer includes spring-loaded contact pins for making the connection.

Sayre et al. U.S. Pat. No. 5,773,988, the disclosure of which is incorporated by reference herein, discloses a hybrid test fixture in which various spring loaded probes, guide plates and wires are utilized to make connection between a test board and a printed circuit board.

Antonello et al. U.S. Pat. No. 5,767,692, the disclosure of which is incorporated by reference herein, discloses a test fixture consisting of plates and long needles for converting between the test grid and the grid of the printed circuit board under test.

Kimura et al. U.S. Pat. No. 5,574,382, the disclosure of which is incorporated by reference herein, discloses an interposer consisting of spring loaded needles for testing a printed circuit board. Also disclosed is a pitch-converting board for converting between the pitch of the printed circuit board contacts under test and the contacts of the test board.

In view of the above, it is a purpose of the present invention to have an interposer for temporarily connecting a ceramic substrate to a test bed for electrical testing.

It is another purpose of the present invention to have an interposer for temporarily connecting a ceramic substrate to a test bed for electrical testing and which will also accommodate a different grid between the ceramic substrate and the test bed.

BRIEF SUMMARY OF THE INVENTION

A first aspect of the invention relates to an interposer for maintaining temporary contact between a substrate and a pogo pin contactor comprising:

a nonconductive body having first and second surfaces and having at least one cavity within the nonconductive body, the at least one cavity comprising a central portion and first and second passageways connecting between the central portion and the first and second surfaces, respectively, of the nonconductive body, wherein one of the first and second passageways is adapted to receive a pogo pin contactor and the other of the first and second passageways is adapted to facilitate contact with a substrate; and a rigid, electrically conductive element freely moveable within the central portion of the nonconductive body for making contact with and between the pogo pin and a contact element of the substrate through the first and second passageways.

A second aspect of the invention relates to a test structure for testing at least one electrical property of a substrate comprising:

a test bed having at least one pogo pin contactor; and an interposer for maintaining temporary contact between a substrate and the pogo pin contactor, the interposer comprising:

a nonconductive body having first and second surfaces and having at least one cavity within the nonconductive body, the at least one cavity comprising a central portion and first and second passageways connecting between the central portion and the first and second surfaces, respectively, of the nonconductive body, wherein one of the first and second passageways is adapted to receive the pogo pin contactor and the other of the first and second passageways is adapted to facilitate contact with a substrate; and a rigid, electrically conductive element freely moveable within the central portion of the nonconductive body for making contact with and between the pogo pin and a contact element of the substrate.

A third aspect of the invention relates to an interposer and grid transformer for maintaining temporary contact between a substrate and a plurality of pogo pin contactors comprising:

a nonconductive body having first and second adjoining layers;

the first layer containing a plurality of pogo pins set in a first grid for contacting a substrate;

a second layer having a plurality of pads on a surface of the second layer set in a second grid for contacting the pogo pin contactors, the plurality of pads in electrical contact with the pogo pins in the first layer; and wherein the first grid is on a smaller pitch than the second grid.

A fourth aspect of the invention relates to a test structure for testing at least one electrical property of a substrate comprising:

a test bed having a plurality of pogo pin contactors; and
an interposer for maintaining temporary contact between a substrate and the pogo pin contactors, the interposer comprising:
a nonconductive body having first and second adjoining layers;
the first layer containing a plurality of pogo pins set in a first grid for contacting a substrate;
a second layer having a plurality of pads on a surface of the second layer set in a second grid for contacting the pogo pin contactors, the plurality of pads in electrical contact with the pogo pins in the first layer; and
wherein the first grid is on a smaller pitch than the second grid.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
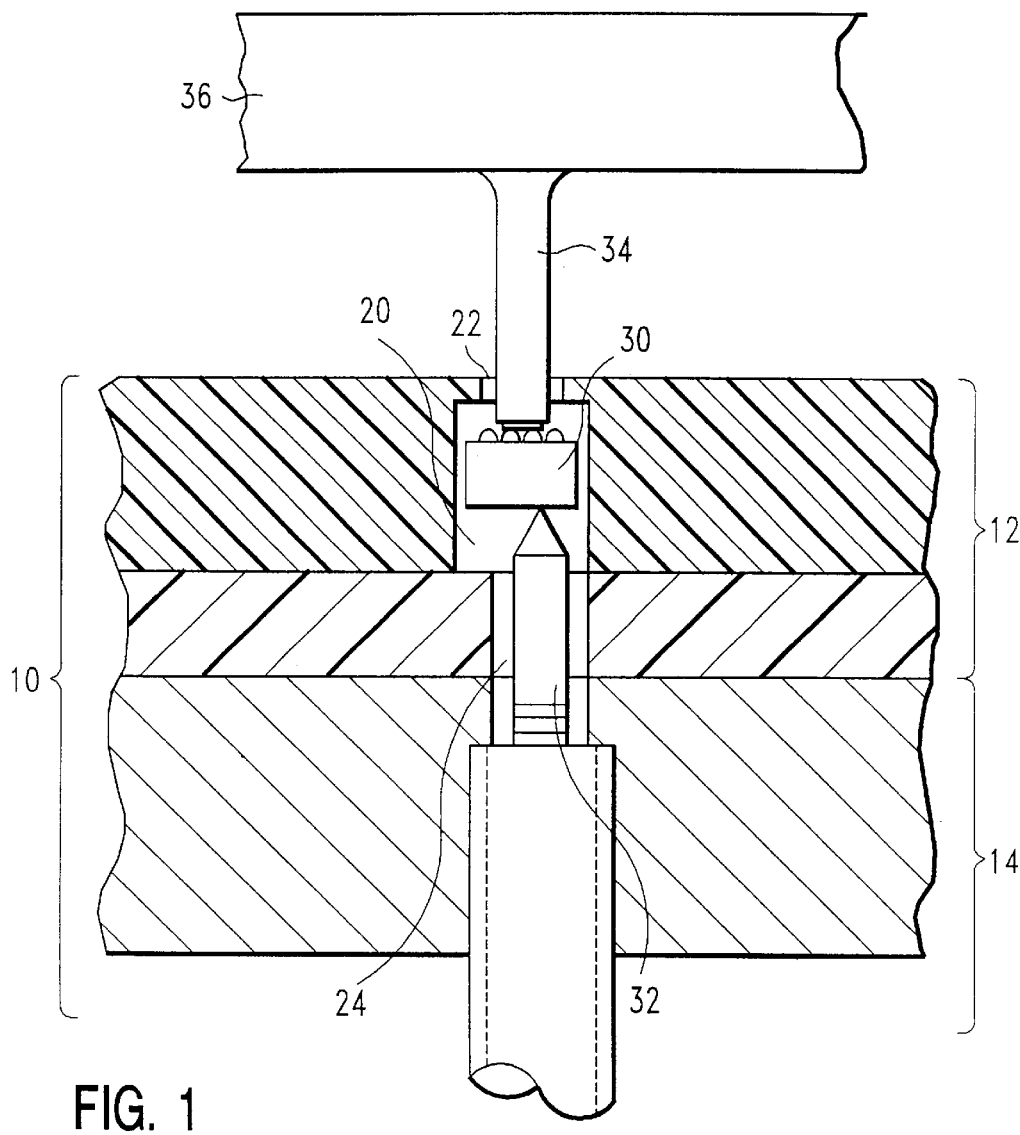
FIG. 1 is a partial cross sectional view of a first test structure according to the present invention.

Referring to the Figures in more detail, and particularly referring to FIG. 1, there is shown a test structure 10 which is comprised of interposer 12 and test bed 14.

Figure 2:
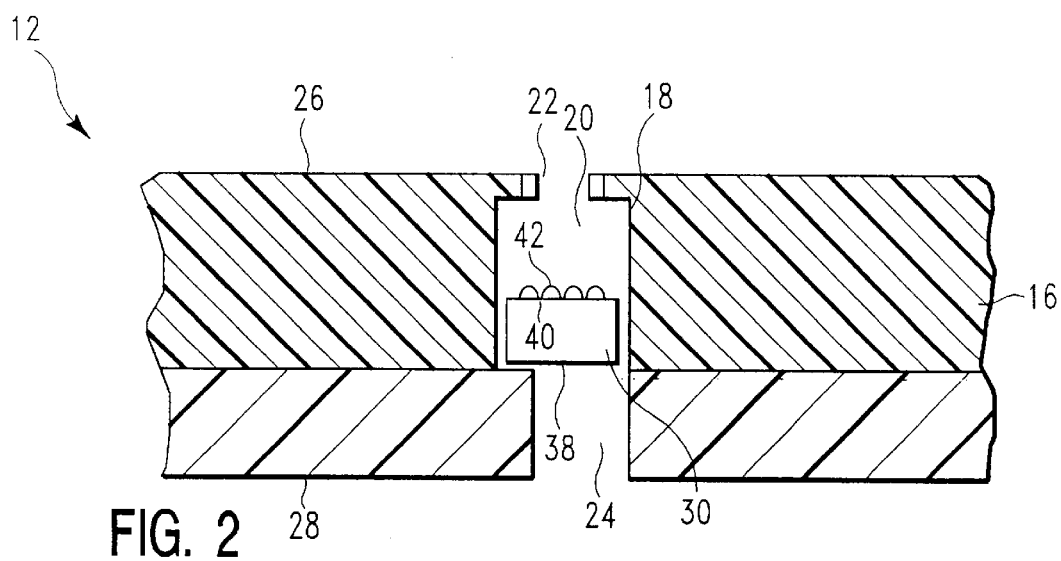
FIG. 2 is a partial cross sectional view of the interposer (enlarged) of FIG. 1.

Referring now to FIG. 2, interposer 12 is removed from the test structure 10 and enlarged. Interposer 12 includes nonconductive body 16 having at least one cavity 18. The cavity 18 includes a central portion 20, first passageway 22 and second passageway 24. First passageway 22 connects the central portion 20 with first surface 26 of the nonconductive body 16 while second passageway 24 connects the central portion 20 with second surface 28 of the nonconductive body 16. Contained within central portion 20 is a rigid, electrically conductive element 30 which is freely moveable within central portion 20 but due to the smaller first and second passageways 22, 24, it is captured within central portion 20. By "rigid, conductive element", it is meant that it is not flexible or springy as would be the case if the conductive element contained a spring or similar device.

Nonconductive body 16 may be made of any nonconductive material typically used in the electronics industry. The present inventors have used fiberglass impregnated epoxy as their nonconductive body. Other materials, such as ceramics, could also be used.

Referring now back to FIG. 1, it can be seen that second passageway 24 is sized to receive pogo pin contactor 32 from test bed 14. As also shown in FIG. 1, first passageway 22 is sized to receive input/output pin 34 from ceramic substrate 36.

Test bed 14 is typically stationary such as part of a table or workbench. In operation, interposer 12 would be placed on test bed 14. Pogo pin contactor 32 would protrude into second passageway 24 and make contact with conductive element 30. Since conductive element 30 is freely moveable within central portion 20, conductive element 30 would move upwardly in conjunction with the upward movement of pogo pin contactor 32. Then, input/output pin 34 of ceramic substrate 36 would be brought into contact with conductive element 30. In this manner, the wiring net (not shown) electrically connected to input/output pin 34 in ceramic substrate 36 is further electrically connected to test bed 14 and thus may be tested by test bed 14.

As shown in FIGS. 1 and 2, the conductive element 30 is cylindrically shaped with a length sufficient to prevent binding of the conductive element 30 within central portion 20. Preferably, one surface 38 of the conductive element 30 is flat or planar while the other surface 40 of the conductive element 30 has at least one pointed projection 42. Most preferably, there will be a plurality of such pointed projections 42 which assist in making good contact with input/output pin 34.

The conductive element 30 may be made of any conductive material such as copper, brass or steel. It may be desirable to gold plate the conductive element 30 so that good electrical contact is maintained.

As can be appreciated, there will usually be a plurality of cavities 18, pogo pin contactors 32 and conductive elements 30 for making electrical contact with a plurality of input/output pins 34 from ceramic substrate 36. Only one such cavity 18, pogo pin contactor 32, conductive element 30 and input/output pin 34 are shown in the Figures for clarity.

Figure 3:
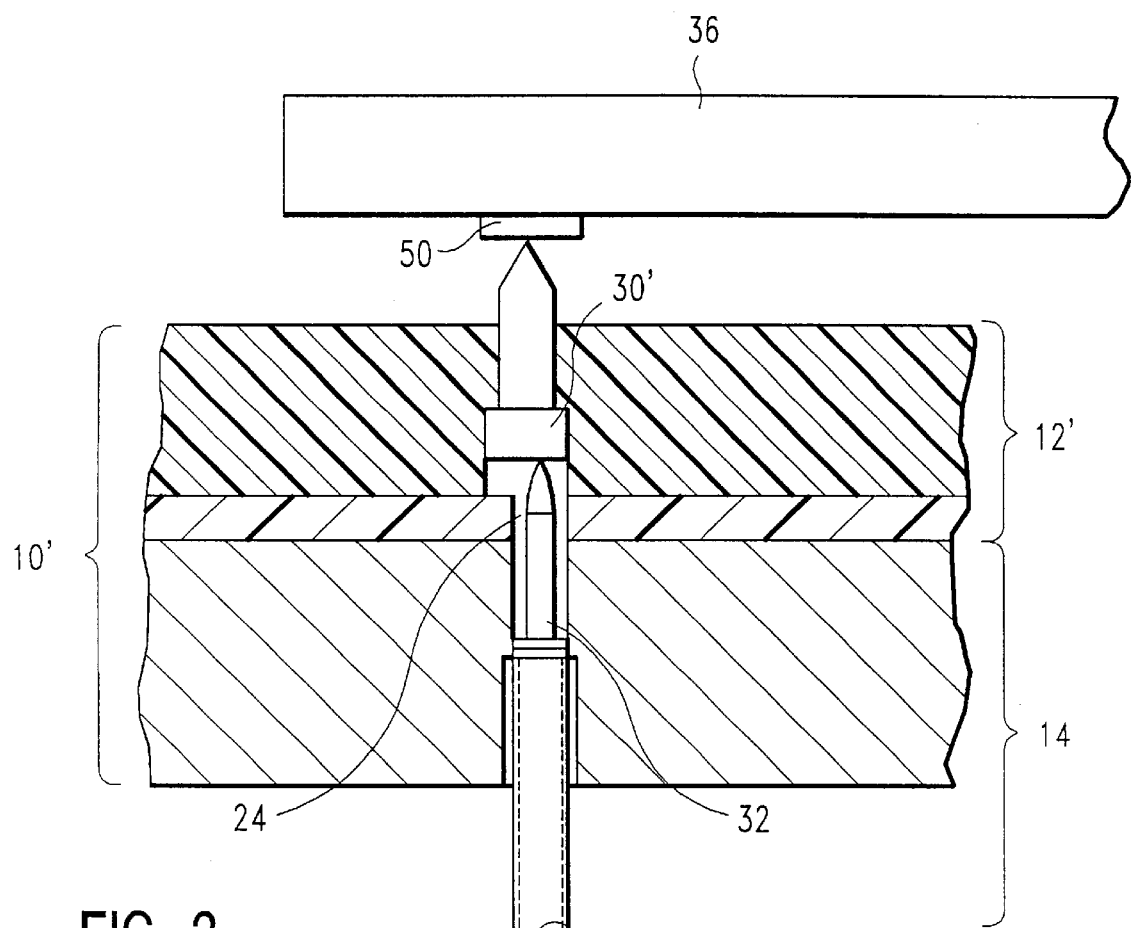
FIG. 3 is a partial cross sectional view of a second test structure according to the present invention.

Referring now to FIG. 3, a second embodiment of the test structure 10' is illustrated. Test structure 10' is substantially similar to test structure 10 previously discussed with respect to FIGS. 1 and 2, except that now rigid, conductive element 30' is a pin that makes contact with an input/output pad 50 on ceramic substrate 36.

Figure 4:
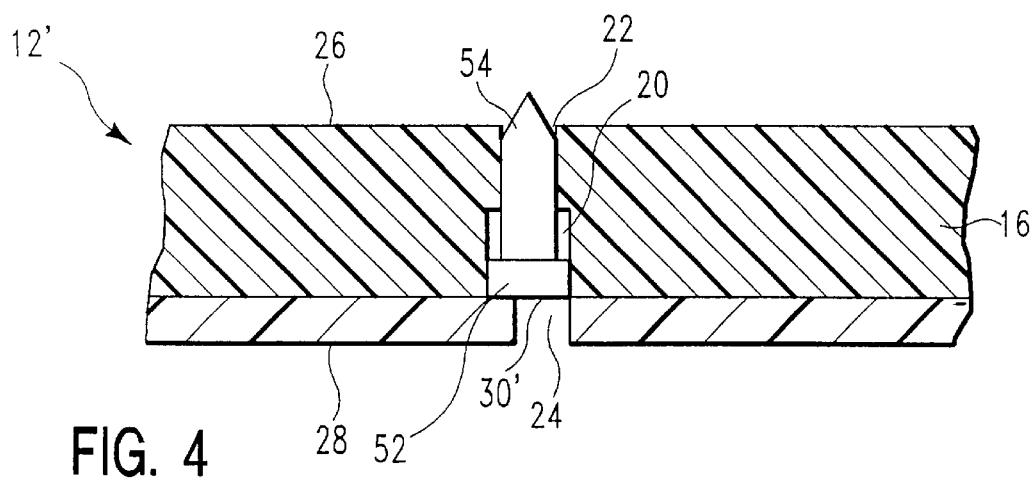
FIG. 4 is a partial cross sectional view of the interposer (enlarged) of FIG. 3.

As best seen in FIG. 4, pin 30' has a head 52 which is wholly contained and captured within central portion 20 and a shank 54 which protrudes through first passageway 22. Head 52 of pin 30' freely floats within central portion 20 until firmly engaged by pogo pin contactor 32 and input/output pad 50.

Figure 5:
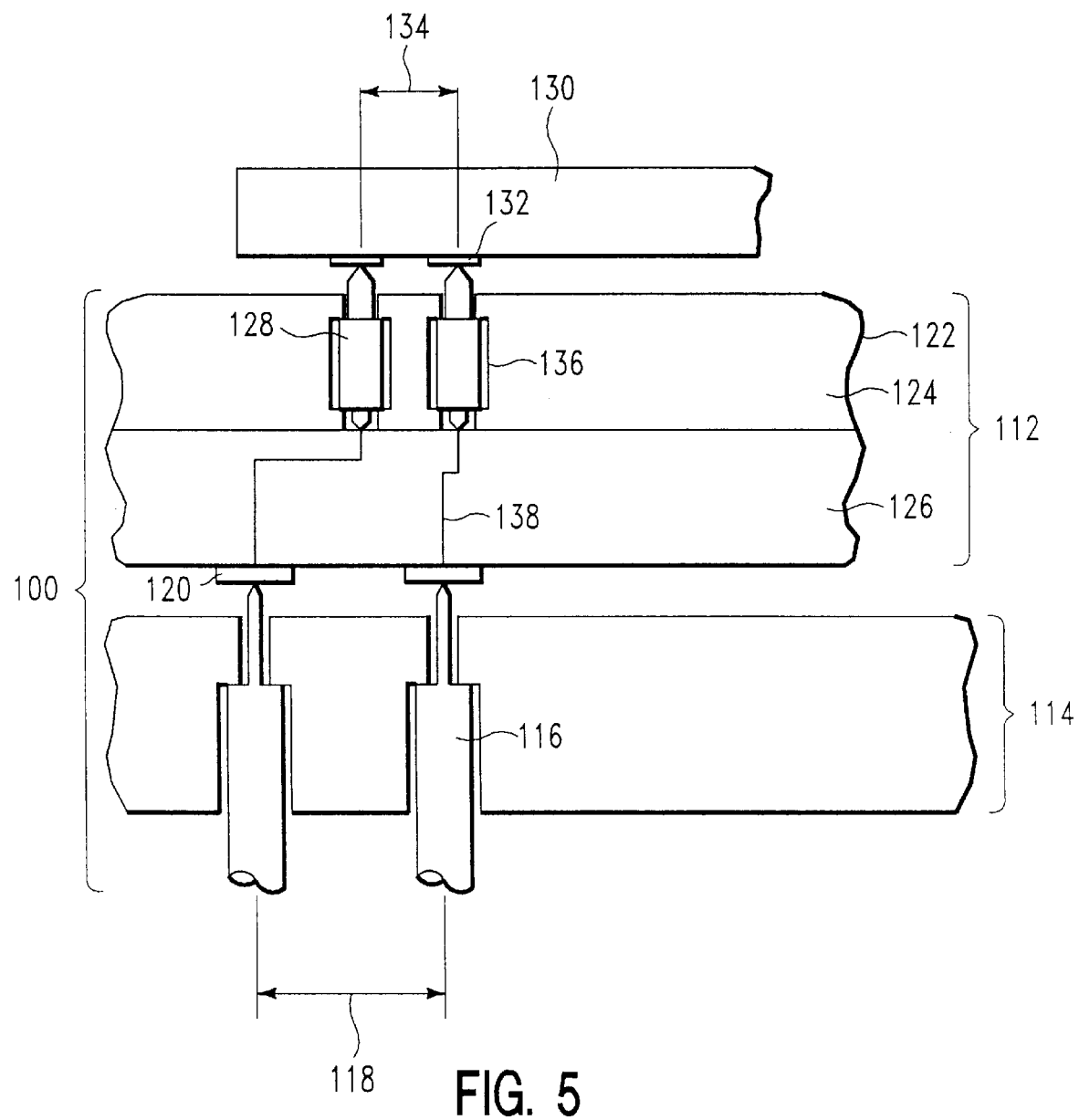
FIG. 5 is a partial cross sectional view of a third test structure according to the present invention.

Referring now to FIG. 5, a third embodiment of the present invention is illustrated. Test structure 100 includes interposer 112 and test bed 114.

Test bed 114 comprises a plurality of pogo pin contactors 116 which are set on a grid having spacing or pitch 118. Pogo pin contactors make contact with pads 120 of interposer 112.

Interposer 112 connects test bed 114 with ceramic substrate 130 for the purpose of testing the wiring nets (not shown) in ceramic substrate 130. Ceramic substrate 130 has input/output pads 132 which are set on a grid having spacing 134. Grid spacing 134 is less than grid spacing 118. Accordingly, in addition to electrically connecting ceramic substrate pads 132 with pogo pin contactors 116, it is necessary for the interposer 112 to also convert the grid spacing 134 of the ceramic substrate 130 to the larger grid spacing 118 of the test bed 114.

Interposer 112 has been designed to achieve the dual purposes noted in the preceding paragraph. Thus, interposer 112 includes a nonconductive body 122 having first and second adjoining layers, 124, 126, respectively. The first layer 124 has a plurality of pogo pins 128, each of which is set in a cavity 136 in first layer 124. The plurality of pogo pins 128 have a grid spacing the same as the grid spacing 134 of input/output pads 132 of ceramic substrate 130. Second layer 126 has pads 120 which electrically connect by wiring 138 with the plurality of pogo pins 128 in first layer 124. Pads 120 are set on a grid spacing that corresponds to that of the pogo pin contactors 118.

As with the first two embodiments of the present invention, nonconductive body 124 may be made of any nonconductive material that is conventionally used in the electronics industry. The present inventors prefer fiberglass impregnated epoxy for their nonconductive body but other materials such as ceramics could also be used. To handle wiring 138, it is preferred that layer 126 actually be made up of several sublayers.

Reference throughout this application has been made to the testing of ceramic substrates. It should be understood, however, that the principles embodied in the present application are equally applicable to non-ceramic substrates such as fiberglass impregnated epoxy printed circuit boards and the like.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. An interposer for maintaining temporary contact between a substrate and a telescoping, spring-loaded connecting pin comprising:
   a nonconductive body having first and second surfaces and having at least one cavity within the nonconductive body, the at least one cavity comprising a central portion and first and second passageways connecting between the central portion and the first and second surfaces, respectively, of the nonconductive body, wherein one of the first and second passageways is limited to receive only a telescoping, spring-loaded connecting pin and the other of the first and second passageways is adapted to facilitate contact with a substrate; and
   a rigid, electrically conductive element freely moveable within the central portion of the nonconductive body for making contact with and between the telescoping, spring-loaded connecting pin and a contact element of the substrate through the first and second passageways.

2. The interposer of claim 1 wherein the conductive element is a cylinder wholly contained within the central portion of the nonconductive body.

3. The interposer of claim 2 wherein the cylinder has a flat side and a side with at least one pointed projection.

4. The interposer of claim 1 wherein said rigid electrically conductive element is a pin having a head and a shank, wherein the head is wholly contained within the central portion of the nonconductive body and the shank extends through one of the first and second passageways.

5. The interposer of claim 1 wherein there are a plurality of cavities and conductive elements.

6. A test structure for testing at least one electrical property of a substrate comprising:
   a test bed having at least one telescoping, spring-loaded connecting pin; and
   an interposer for maintaining temporary contact between a substrate and the telescoping, spring-loaded connecting pin, the interposer comprising:
   a nonconductive body having first and second surfaces and having at least one cavity within the nonconductive body, the at least one cavity comprising a central portion and first and second passageways connecting between the central portion and the first and second surfaces, respectively, of the nonconductive body, wherein one of the first and second passageways is limited to receive only the telescoping, spring-loaded connecting pin and the other of the first and second passageways is adapted to facilitate contact with a substrate; and
   a rigid, electrically conductive element freely moveable within the central portion of the nonconductive body for making contact with and between the telescoping, spring-loaded connecting pin and a contact element of the substrate.

7. The test structure of claim 6 wherein the conductive element is a cylinder wholly contained within the central portion of the nonconductive body.

8. The test structure of claim 7 wherein the cylinder has a flat side for making contact with the telescoping, spring-loaded connecting pin and a side with at least one pointed projection for making contact with the contact element of the substrate.

9. The test structure of claim 6 wherein said rigid electrically conductive element is a pin having a head and a shank, wherein the head is wholly contained within the central portion of the nonconductive body and the shank extends through one of the first and second passageways and wherein the head makes contact with the pogo pin contactor and the shank makes contact with the contact element of the substrate.

10. The test structure of claim 6 wherein there are a plurality of telescoping, spring-loaded connecting pins, cavities and conductive elements.

* * * * *